United States Patent
Yu et al.

(10) Patent No.: US 12,040,347 B2
(45) Date of Patent: Jul. 16, 2024

(54) DISPLAY PANEL AND DETECTION METHOD THEREFOR, AND DISPLAY DEVICE

(71) Applicant: Shanghai Tianma Micro-Electronics Co., Ltd., Shanghai (CN)

(72) Inventors: Quanpeng Yu, Shanghai (CN); Feng Lu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 418 days.

(21) Appl. No.: 17/529,882

(22) Filed: Nov. 18, 2021

(65) Prior Publication Data

US 2022/0077229 A1    Mar. 10, 2022

(30) Foreign Application Priority Data

Jun. 30, 2021   (CN) .......................... 202110736654.0

(51) Int. Cl.
| | |
|---|---|
| *H01L 33/62* | (2010.01) |
| *G09G 3/00* | (2006.01) |
| *H01L 27/15* | (2006.01) |
| *H01L 33/38* | (2010.01) |

(52) U.S. Cl.
CPC ........... *H01L 27/156* (2013.01); *G09G 3/006* (2013.01); *H01L 33/38* (2013.01); *H01L 33/62* (2013.01)

(58) Field of Classification Search
CPC ....... H01L 27/156; H01L 33/38; H01L 33/62; H01L 33/60; H01L 25/0753; G09G 3/006; G09G 2300/0408; G09G 2300/0426; G09G 3/32
USPC .......................................................... 257/79
See application file for complete search history.

(56) References Cited

U.S. PATENT DOCUMENTS 11,456,338 B2 * 9/2022 Lee ...................... H10K 50/856

FOREIGN PATENT DOCUMENTS

| CN | 110546598 A | 12/2019 |
|---|---|---|
| CN | 112270895 A | 1/2021 |

* cited by examiner

*Primary Examiner* — Tan N Tran
(74) *Attorney, Agent, or Firm* — KDW Firm PLLC

(57) ABSTRACT

Provided are a display panel and a detection method therefor, and a display device. A first substrate of the display panel includes a first base plate and light-emitting elements. A second substrate opposite to the first substrate includes a second base plate and a retaining wall structure. An orthographic projection of the retaining wall structure onto the first substrate is located between adjacent light-emitting elements. The first substrate includes a first electrode, the second substrate includes a second electrode. In a first direction perpendicular to a plane where the display panel is located, the first electrode and the second electrode at least partially overlap as a first overlap, and the retaining wall structure and the first overlap at least partially overlap. The first and second electrodes are electrically connected to first signal terminal and second signal terminal, respectively.

17 Claims, 13 Drawing Sheets

DISPLAY PANEL AND DETECTION METHOD THEREFOR, AND DISPLAY DEVICE

CROSS-REFERENCE TO RELATED APPLICATION

This application claims priority to Chinese Patent Application No. 202110736654.0 filed on Jun. 30, 2021, the disclosure of which is incorporated herein by reference in its entirety.

TECHNICAL FIELD

Embodiments of the present disclosure relate to the field of display technologies and, in particular, to a display panel and a detection method therefor, and a display device.

BACKGROUND

With the development of display technologies, various electronic devices with display function have been widely applied to and brought great convenience to people's daily life and work. Such devices have now become important and indispensable tools for people.

In a display panel formed by Micro Light-Emitting Diodes (LEDs) or Mini LEDs, beams emitted by adjacent Micro LEDs or Mini LEDs may interfere with each other, which adversely affects the display performance.

SUMMARY

Embodiments of the present disclosure provide a display panel and a detection method therefor, and a display device.

In a first aspect, a display panel is provided according to an embodiment of the present disclosure. The display panel includes a first substrate and a second substrate which are disposed oppositely.

The first substrate includes a first base plate and light-emitting elements. The light-emitting elements are located on a side of the first base plate near the second substrate. The second substrate includes a second base plate and a retaining wall structure. The retaining wall structure is located on a side of the second base plate near the first substrate. The orthographic projection of the retaining wall structure onto the first substrate is located between adjacent light-emitting elements.

The first substrate includes a first electrode. The second substrate includes a second electrode. In a first direction, the first electrode and the second electrode at least partially overlap as a first overlap. The retaining wall structure and the first overlap at least partially overlap. The first direction is a direction perpendicular to a plane where the display panel is located.

The first electrode is electrically connected to a first signal terminal. The second electrode is electrically connected to a second signal terminal. One of the first signal terminal and the second signal terminal is a signal detection terminal, and the other is a signal input terminal.

In a second aspect, a detection method for a display panel is provided according to an embodiment of the present disclosure. The detection method is applicable to the display panel described above and includes the steps described below.

A direct current charging signal is inputted into a signal input terminal.

A sensing signal at a signal detection terminal is detected to obtain a charging duration.

Capacitance values of capacitors formed by a first overlap formed by the first electrode and the second electrode at different positions are compared according to the charging durations.

A thickness between the first electrode and the second electrode is determined according to the capacitance value of the capacitor.

In a third aspect, a display device is provided according to an embodiment of the present disclosure. The display device includes a display panel. The display panel includes a first substrate and a second substrate which are disposed oppositely.

The first substrate includes a first base plate and light-emitting elements. The light-emitting elements are located on a side of the first base plate near the second substrate. The second substrate includes a second base plate and a retaining wall structure. The retaining wall structure is located on a side of the second base plate near the first substrate. The orthographic projection of the retaining wall structure onto the first substrate is located between adjacent light-emitting elements.

The first substrate includes a first electrode. The second substrate includes a second electrode. In a first direction, the first electrode and the second electrode at least partially overlap as a first overlap. The retaining wall structure and the first overlap at least partially overlap. The first direction is a direction perpendicular to a plane where the display panel is located.

The first electrode is electrically connected to a first signal terminal. The second electrode is electrically connected to a second signal terminal. One of the first signal terminal and the second signal terminal is a signal detection terminal, and the other is a signal input terminal.

DETAILED DESCRIPTION

Figure 1:
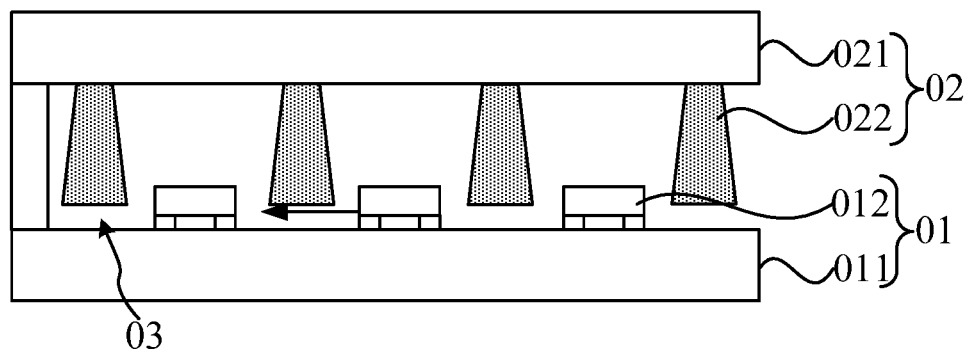
FIG. 1 is a schematic structural view of a display panel.

The present disclosure is further described hereinafter in detail in conjunction with drawings and embodiments. It is understandable that embodiments described hereinafter are intended to explain the present disclosure, not to limit the present disclosure. Additionally, it is noted that for ease of description, only part, not all, of structures related to the present disclosure are illustrated in the drawings.

Terms used in the embodiments of the present disclosure are merely used for describing specific embodiments and not intended to limit the present disclosure. It is to be noted that nouns of locality, including "above", "below", "left", and "right", used in the embodiments of the present disclosure are described from the angles illustrated in the drawings and are not to be construed as a limitation to the embodiments of the present disclosure. Additionally, in the context, it is to be understood that when an element is formed "on" or "under" another element, the element may be directly formed "on" or "under" another element or may be indirectly formed "on" or "under" another element via an intermediate element. The terms "first", "second" and the like are merely descriptive and used to distinguish between different components rather than indicate any order, quantity or importance. For those of ordinary skill in the art, the preceding terms in the present disclosure can be construed according to specific situations.

FIG. 1 is a schematic structural view of a display panel. With reference to FIG. 1, the display panel includes a first substrate 01 and a second substrate 02 which are disposed opposite to each other. The first substrate 01 includes a first base plate 011 and multiple light-emitting elements 012 located on a side of the first base plate 011 near the second substrate 02. The second substrate 02 includes a second base plate 021 and a retaining wall structure 022 located on a side of the second base plate 021 near the first substrate 01. The retaining wall structure 022 is used for separating different light-emitting elements 012, thereby avoiding interference between beams emitted from different light-emitting elements 012. Ideally, when the first substrate 01 and the second substrate 02 are attached, a bottom surface of the retaining wall structure 022 is in contact with the first base plate 011. However, it is impossible to know the distance between the retaining wall structure 022 and the first base plate 011 when the first substrate 01 and the second substrate are attached. When an attachment thickness is insufficient, there will be a gap 03 between the retaining wall structure 022 and the first base plate 011. Herein, the attachment thickness refers to an attaching degree of the second substrate to the first substrate. At this point, lateral light leakage may occur between adjacent light-emitting elements 012, which affects the display performance of the display panel.

Figure 2:
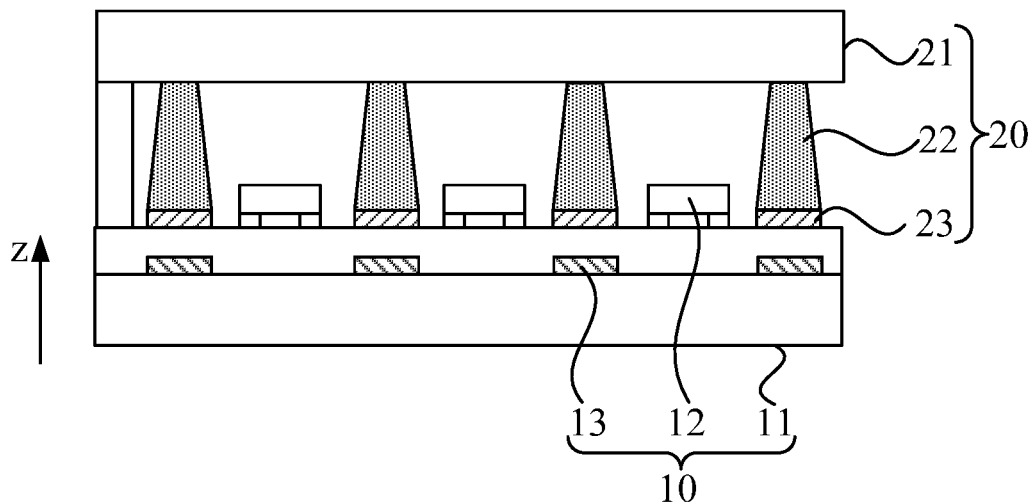
FIG. 2 is a schematic structural view of a display panel according to an embodiment of the present disclosure.

In view of the above, a display panel is provided according to an embodiment of the present disclosure. FIG. 2 is a schematic structural view of a display panel according to an embodiment of the present disclosure. With reference to FIG. 2, the display panel provided by the embodiment of the present disclosure includes a first substrate 10 and a second substrate 20 which are disposed oppositely. The first substrate 10 includes a first base plate 11 and light-emitting elements 12. The light-emitting elements 12 are located on a side of the first base plate 11 near the second substrate 20. The second substrate 20 includes a second base plate 21 and a retaining wall structure 22. The retaining wall structure 22 is located on a side of the second base plate 21 near the first substrate 10. An orthographic projection of the retaining wall structure 22 onto the first substrate 10 is located between adjacent light-emitting elements 12. The first substrate 10 includes a first electrode 13. The second substrate 20 includes a second electrode 23. In a first direction z, the first electrode 13 and the second electrode 23 at least partially overlap as a first overlap (FIG. 2 shows the sectional view of the display panel so the shape of the first overlap is not shown). The retaining wall structure 22 and the first overlap at least partially overlap in the first direction z. The first direction z is a direction perpendicular to a plane where the display panel is located. The first electrode 13 is electrically connected to a first signal terminal. The second electrode 23 is electrically connected to a second signal terminal. One of the first signal terminal and the second signal terminal is a signal detection terminal, and the other is a signal input terminal.

The first base plate 11 and the second base plate 21 may be rigid base plates such as glass base plates, or may be flexible base plates such as polyimide (PI) base plates. The light-emitting elements 12 may be Mini LEDs or Micro LEDs, and the type of the light-emitting elements 12 is not limited by the embodiment of the present disclosure. A pixel circuit layer (not shown in FIG. 2) is also included, which is located between the first base plate 11 and the light-emitting elements 12. The pixel circuit layer may include an active layer, a gate insulating layer, a gate layer, an interlayer insulating layer, and a source-drain electrode layer which are successively formed on a side of the first base plate 11 near the light-emitting elements 12. The gate layer may form a gate, a scan line, and a first electrode of a storage capacitor of a pixel circuit. The source-drain layer may form a source, a drain, a data line, and a power signal line of a driver circuit. Each of the gate insulating layer and the interlayer insulating layer may be made from an oxide of silicon or a nitride of silicon, which is not limited by the embodiment of the present disclosure. The pixel circuit may also include an intermediate insulating layer and an intermediate metal layer, which are stacked between the gate layer and the interlayer insulating layer in a direction away from the first substrate. The intermediate metal layer is usually used for forming a second electrode of the storage capacitor and a reference voltage line. The first electrode 13 is located at the first substrate 10 and may be disposed in the same layer as a certain metal layer in the pixel circuit layer, which can be designed according to the actual situation during specific implementation. The second electrode 23 is located at the second substrate, and the first overlap where the first electrode 13 and the second electrode 23 overlap forms a detection capacitor. In the following description, the first overlap refers to a region where the detection capacitor is located. The first overlap at least partially overlaps the retaining wall structure 22. The first electrode 13 is electrically connected to the first signal terminal. The second electrode 23 is electrically connected to the second signal terminal. One of the first signal terminal and the second signal terminal is a signal detection terminal, and the other is a signal input terminal, which can be selected according to the actual situation during specific implementation.

Figure 3:
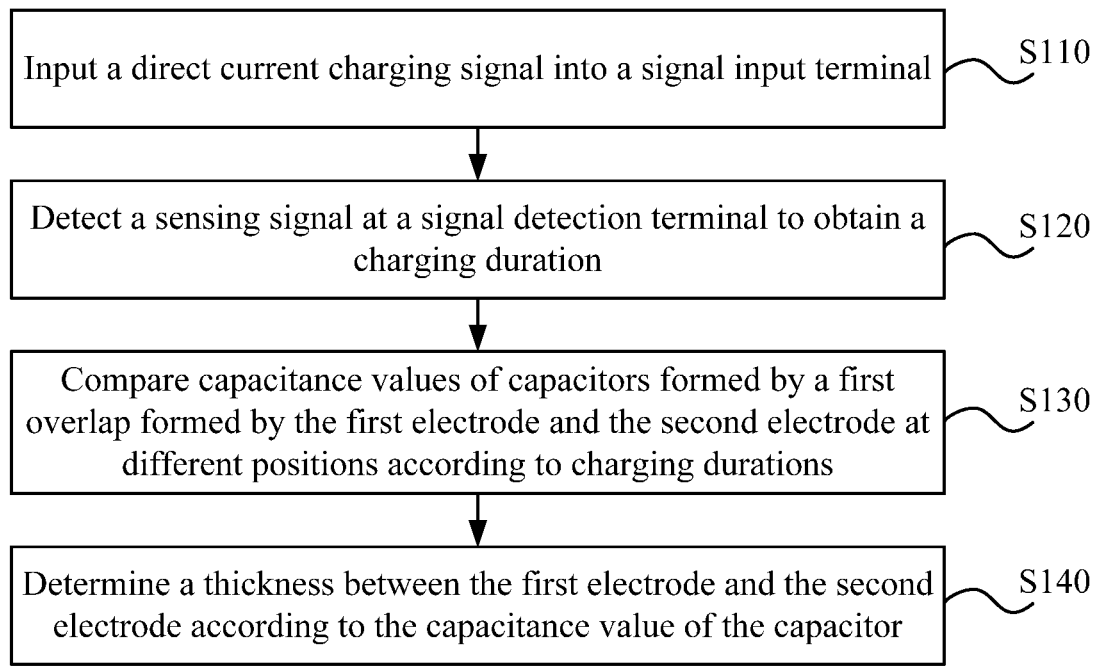
FIG. 3 is a flowchart of a detection method for a display panel according to an embodiment of the present disclosure.

A detection method for a display panel is further provided according to an embodiment of the present disclosure. The detection method is applied to the display panel described above. FIG. 3 is a schematic flowchart of a detection method of a display panel according to an embodiment of the present disclosure. With reference to FIG. 3, the detection method includes the steps described below.

In step S110, a direct current charging signal is inputted into a signal input terminal.

When the first signal terminal is a signal input terminal, the direct current charging signal is inputted into the first electrode, and when the second signal terminal is a signal input terminal, the direct current charging signal is inputted into the second electrode.

In step S120, a sensing signal at a signal detection terminal is detected to obtain a charging duration.

It is understandable that when one electrode of the capacitor is charged, the other electrode of the capacitor can monitor the sensing signal, and after the capacitor is fully charged, the sensing signal drops to zero, so that the charging duration of the capacitor can be measured. When the second signal terminal is a signal detection terminal, the sensing signal of the second electrode is detected, and when the first signal terminal is a signal detection terminal, the sensing signal of the first electrode is detected.

In step S130, capacitance values of capacitors formed by a first overlap formed by the first electrode and the second electrode at different positions are compared according to charging durations.

According to the calculation formula of the capacitance $$C = \frac{\varepsilon S}{d},$$

where C represents the capacitance value of a capacitor, E represents the dielectric constant of the dielectric between two plates of the capacitor, S represents the area of the plates, and D represents the distance between the two plates; when the capacitors are charged with the same signal, the longer the charging duration is, the larger the capacitance value is.

In step S140, a thickness between the first electrode and the second electrode is determined according to the capacitance value of the capacitor.

Since the first overlap of the first electrode and the second electrode at least partially overlaps the retaining wall, the thickness between the first electrode and the second electrode may be determined according to the capacitance value of the capacitor, so as to know whether the first substrate and the second substrate are accurately aligned and whether there is a gap between the retaining wall structure and the first substrate as shown in FIG. 1. The detection method can be used in the preparation process of the display panel. If it is detected that there is an obvious gap between the retaining wall structure and the first substrate, the production needs to be stopped to investigate the reasons and improve the process, thereby avoiding the continued production of unqualified products.

In the technical solution of the embodiment of the present disclosure, the light-emitting elements are disposed on a side of the first base plate near the second substrate, and the light-emitting elements are used for image displaying; a retaining wall structure is disposed on a side of the second base plate near the first substrate, and the orthographic projection of the retaining wall structure onto the first substrate is located between adjacent light-emitting elements, so that different light-emitting elements are isolated; a first electrode is set at the first substrate, the second electrode is set at the second substrate, and a first overlap of the first electrode and the second electrode forms a thickness measuring capacitor; the first electrode is set to be electrically connected to the first signal terminal, the second electrode is set to be electrically connected to the second signal terminal, and one of the first signal terminal and the second signal terminal is a signal detection terminal, and the other is a signal input terminal, so that capacitance of the thickness measuring capacitor is measured according to the signal of the first signal terminal and the second signal terminal; the retaining wall structure and the first overlap are set to at least partially overlap so that an attachment thickness of the retaining wall structure is obtained according to the measurement result of the thickness measuring capacitor, thereby avoiding the poor preparation of the display panel.

On the basis of the above-mentioned embodiment, in an embodiment, the signal detection terminal is electrically connected to a detection circuit, and the detection circuit measures the capacitance value of the capacitor of the first overlap according to the charging duration.

The detection circuit may be disposed inside or outside the display panel. Since the detection circuit does not participate in the display and other functions of the display panel, in the embodiment, the detection circuit is set as an external circuit to avoid occupying the wiring space inside the display panel, and the specific structure of the detection circuit is not limited here. When the signal detection terminal is the first signal terminal, the detection circuit is connected to the first substrate, and when the signal detection terminal is the second signal terminal, the detection circuit is connected to the second substrate. In the embodiment, the first overlap refers to a part where the first electrode and the second electrode overlap with each other to form a capacitor, and does not include a wire connecting the first electrode and the first signal terminal and a wire connecting the second electrode and the second signal terminal. In an embodiment, the second signal terminal is a signal detection terminal, that is, a second electrode in the second substrate serves as a detection electrode; the first electrode is disposed in the first substrate, and the first substrate is an array substrate. In this way, it is convenient to set the first electrode to be connected to the driver chip, so that the driver chip can load a direct current charging signal to the first electrode as required. The specific voltage amplitude of the direct current charging signal is not limited and can be designed according to the actual requirements of the panel. In some other embodiment, the first signal terminal may be set as the signal detection terminal, and the direct current signal is loaded to the second electrode, as long as the charging duration can be measured.

Figure 4:
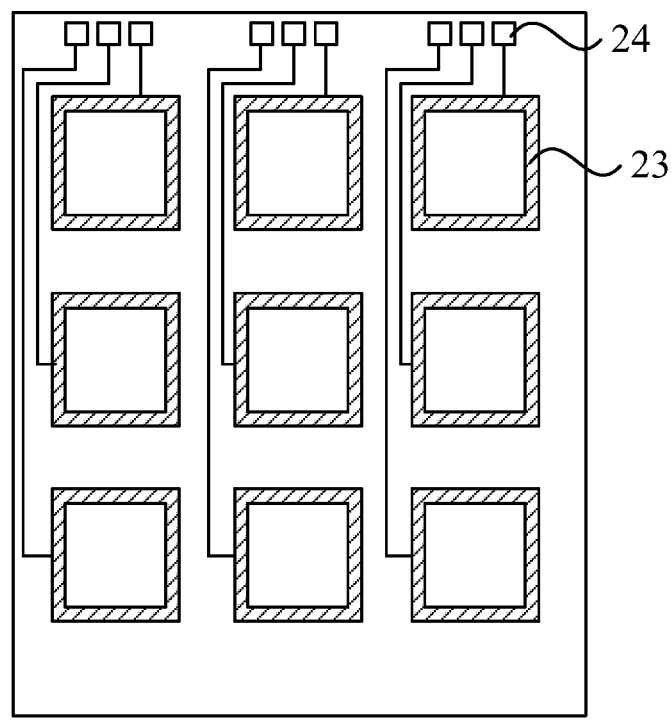
FIG. 4 is a schematic top view of a display panel according to an embodiment of the present disclosure.

FIG. 4 is a schematic top view of a display panel according to an embodiment of the present disclosure. With reference to FIG. 4, in an embodiment, second electrodes 23 are arranged in a matrix on the display panel, and each second electrode 23 is electrically connected to one second signal terminal 24.

It is understood that in the embodiment, capacitors formed by the first overlap of the first electrode and the second electrode are used for reflecting the distance between the retaining wall structure and the first substrate, so the first overlap needs to correspond to the retaining wall structure, that is, the second electrode needs to correspond to the retaining wall structure. Since the retaining wall structure is used for preventing beams emitted by adjacent light-emitting elements from interfering with each other, the retaining wall structure needs to be disposed around the light-emitting elements. Therefore, each second electrode 23 shown in FIG. 4 is in the shape of a box in which at least one light-emitting element (not shown in FIG. 4) is disposed.

In practical implementation, as shown in FIG. 4, the second electrodes 23 may be arranged in rows and columns at equal intervals on the display panel, and one second electrodes 23 is connected to one second signal terminal 24, so as to realize pressure sensing positioning according to a capacitance change caused by deformation of the display panel under pressure. In an embodiment, when a certain position of the display panel is deformed under pressure, an electrical signal is inputted into the first electrode, a charging duration is detected responsively at the second electrode 23, and a position at which the pressure is applied is determined according to a change in the charging duration of one or more capacitors formed by the first overlap of the first electrode and the second electrode. It is noted that the size of the first overlap of the first electrode and the second electrode may be in the order of millimeters, thereby increasing the detection capacitance.

It is understood that when a certain position of the display panel is applied with pressure, the display panel is deformed, which causes that the distance between the first electrode and the second electrode in the display panel is changed and thus causes a change in capacitance of a capacitor formed by the first electrode and the second electrode. At this point, a direct current charging signal is inputted into the first electrode, a charging duration is detected responsively at the second electrode, the change in capacitance value of one or more capacitors at the pressed position causes the change of the charging duration, and the pressed position may be determined by processing obtained signals. Practical implementation may be based on parameters such as a pressing frequency and an electric signal may be inputted to the first electrode according to a certain frequency cyclically, thereby realizing pressure detection.

In practical implementation, first electrodes and second electrodes may be arranged in one-to-one correspondence, or one first electrode may be disposed over an entire surface to simplify the circuit, which may be designed according to the actual situation during specific implementation.

In an embodiment, with reference to FIG. 2, the second electrode 23 is located on a side of the retaining wall structure 22 near the first substrate 10.

The second electrode 23 is located on a side of the retaining wall structure 22 near the first substrate 10, that is, the second electrode 23 is disposed on a lower surface of the retaining wall structure 22, and when the first substrate 10 and the second substrate 20 are accurately aligned, the second electrode 23 is in contact with an upper surface of the first substrate 10. In order to form a capacitor with the first electrode 13, the first electrode 13 is disposed inside the first substrate 10, and a film layer such as a planarization layer may be disposed on the first electrode 13 to cover the first electrode 13.

In an embodiment, in a direction perpendicular to an extension direction of the retaining wall structure, the width of the second electrode is less than or equal to the width of the retaining wall structure.

Figure 5:
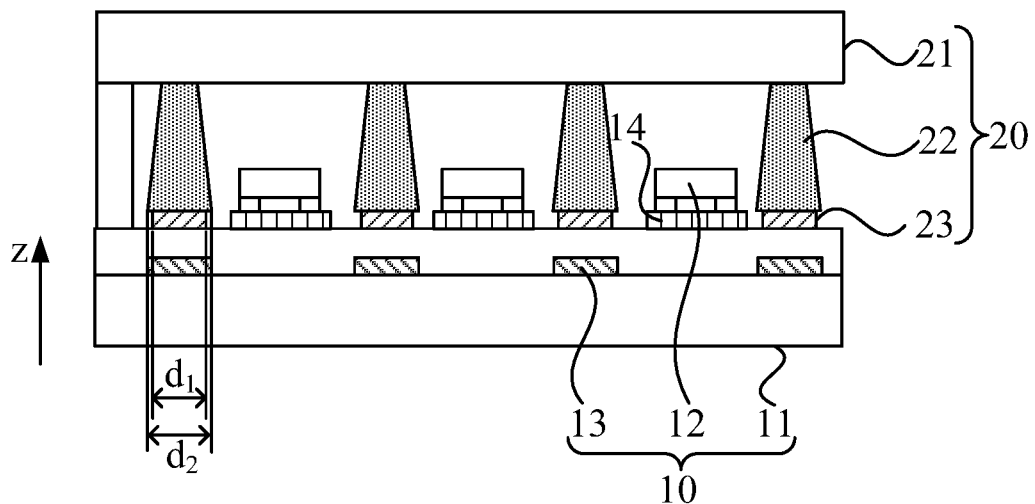
FIG. 5 is a schematic structural view of another display panel according to an embodiment of the present disclosure.

In the configuration shown in FIG. 2, the width of the second electrode 23 is the same as the width of the retaining wall structure 22. Since the light-emitting element is disposed between two adjacent retaining wall structures 22, for example, for a Micro LED, in order to facilitate the connection between the Micro LED and the pixel circuit in the first substrate, an eutectic layer is disposed under the Micro LED. When the second electrode 23 is located under the retaining wall structure 22, the second electrode 23 and the eutectic layer are disposed in the same layer. FIG. 5 is a schematic structural view of another display panel according to an embodiment of the present disclosure. With reference to FIG. 5, an eutectic layer 14 is disposed between the light-emitting element 12 and the first substrate 10, and the eutectic layer 14 is used for connecting a pixel circuit (not shown in FIG. 5) to the light-emitting element 12. The width $d_1$ of the second electrode 23 is less than the width $d_2$ of the retaining wall structure 22 so that the risk of short circuit caused by contact between the second electrode 23 and the eutectic layer 14 can be reduced.

In an embodiment, the retaining wall structure includes a light-shielding material, and the second electrode includes a light-shielding metal.

It is understood that the retaining wall structure has a function to separate different light-emitting elements, cross interference between beams emitted from different light-emitting elements is avoided. Therefore, in the embodiment, a light-shielding structure is made from a light-shielding material, and the second electrode may be made from a metal material such as sliver (Ag), aluminum (Al), and the like. In specific implementation, the second electrode needs to be provided with sufficient thickness to realize the same light-shielding effect, so as to avoid light leakage caused by the translucent effect of a thin metal layer.

In an embodiment, an orthographic projection of the second electrode onto the first substrate surrounds at least one of the light-emitting elements.

Figure 6:
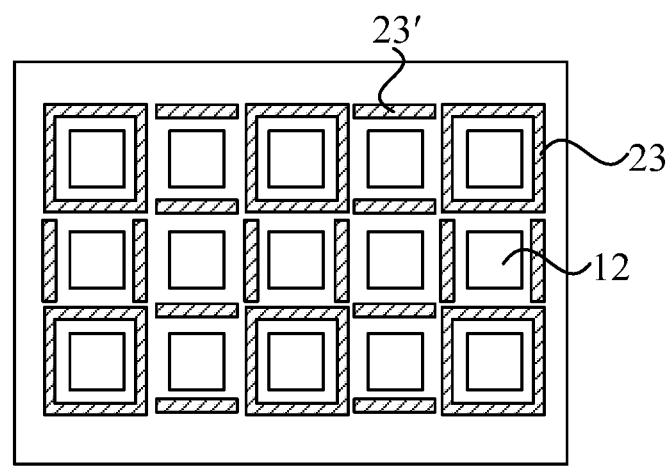
FIG. 6 is a schematic structural view of another display panel according to an embodiment of the present disclosure.

For example, FIG. 6 is a schematic structural view of another display panel according to an embodiment of the present disclosure. With reference to FIG. 6, the display panel includes multiple light-emitting elements 12, and each second electrode 23 surrounds one light-emitting element 12.

It is understood that in the embodiment shown in FIG. 6, not each light-emitting element 12 is surrounded by the second electrode 23, and FIG. 6 illustrates that each second electrode 23 is set to surround one light-emitting element 12 and second electrodes 23 are disposed at intervals. In other embodiments, each second electrode 23 may surround multiple light-emitting elements 12. In a region where no second electrode 23 is disposed, in order to ensure the same film thickness, metal wires 23' which are in the same layer as the second electrode 23 and made of the same material as the second electrode 23 are further disposed, and the metal wires 23' do not need to be connected to signals. Additionally, it is noted that only the shape of a portion of the second electrode 23 for forming the capacitor is shown in FIG. 6 and the signal lines connected to the second signal terminals are not shown.

In an embodiment, multiple light-emitting elements with different colors form one light-emitting unit, and the orthographic projection of the second electrode onto the first substrate surrounds at least one light-emitting unit.

Figure 7:
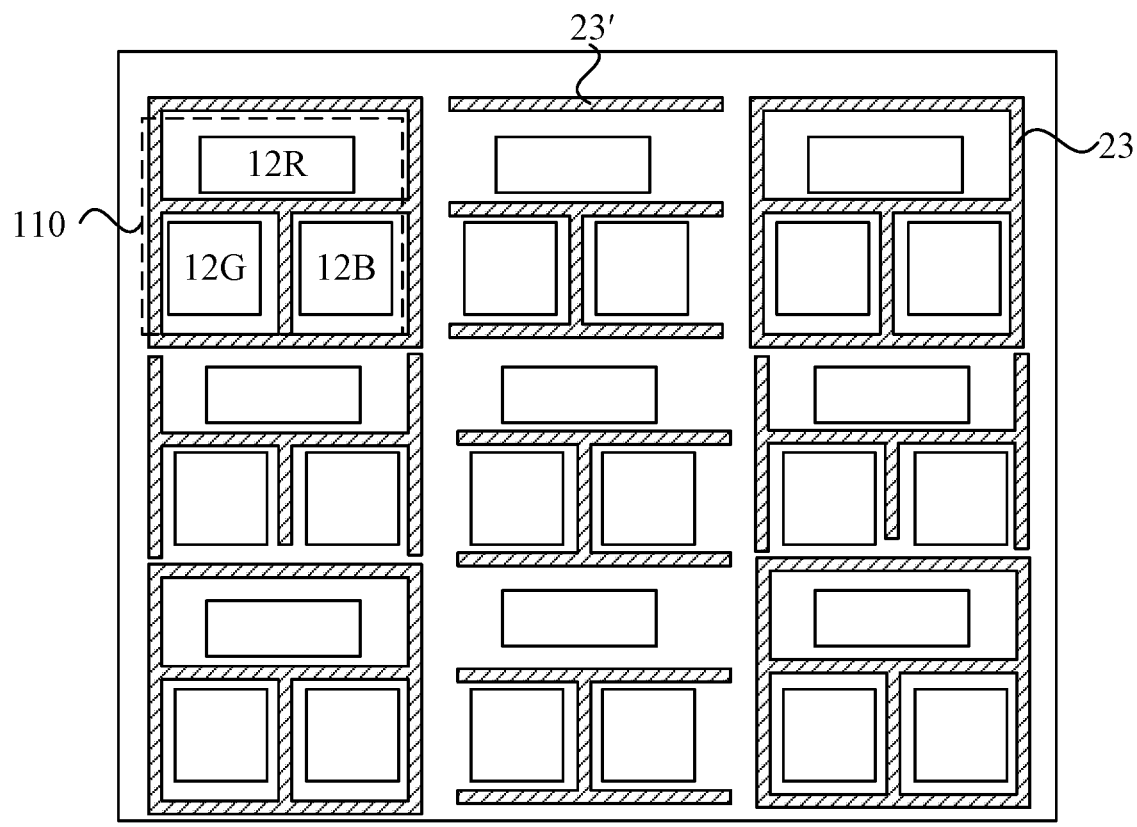
FIG. 7 is a schematic structural diagram of yet another display panel according to an embodiment of the present disclosure.

For example, FIG. 7 is a schematic structural diagram of yet another display panel according to an embodiment of the present disclosure. With reference to FIG. 7, light-emitting elements include red light-emitting elements 12R, green light-emitting elements 12G, and blue light-emitting elements 12B. The red light-emitting element 12R, the green light-emitting element 12G, and the blue light-emitting element 12B form one light-emitting unit 110. Each second electrode 23 surrounds one light-emitting unit 110. Other arrangements are similar to those shown in FIG. 6.

It is noted that in the embodiments shown in FIG. 6 and FIG. 7, the second substrate includes multiple second electrodes 23, and the second electrodes 23 are used as detection electrodes of capacitors; while in other embodiments, the first electrodes of the first substrate may be used as detection electrodes of capacitors, which may be designed according to the actual situation during specific implementation.

In an embodiment, the first electrode or the second electrode is disposed over the entire surface.

It is understood that when multiple second electrodes are set, that is, when the second electrodes are used as detection electrodes, the first electrode may be designed as one electrode over the entire surface, and only one signal line is needed to connect with the first signal terminal, so as to simplify the circuit design, and at this point, the first signal terminal is a signal input terminal; when multiple first electrodes are set, that is, the first electrodes are used as detection electrodes, the second electrode may be designed as one electrode over the entire surface, only one signal line is needed to connect with the second signal terminal, and at this point, the second signal terminal is a signal input terminal. Additionally, it is noted that the entire surface arrangement here means that all the first electrodes or the second electrodes are electrically connected together and are not necessarily to be designed as an entire layer. For example, when the second electrodes are arranged over the entire surface, the second electrodes correspond to the retaining wall structures which are in the shape of a grid, and the regions where the light-emitting elements are located need to be exposed.

Figure 8:
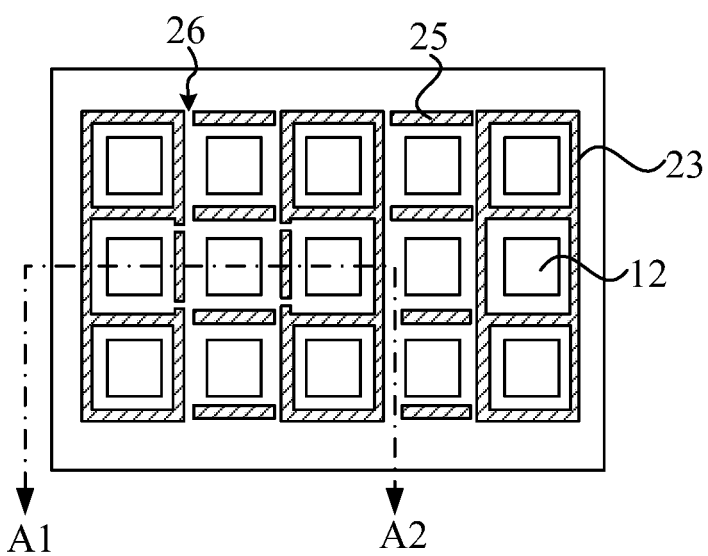
FIG. 8 is a schematic top view of yet another display panel according to an embodiment of the present disclosure.
Figure 9:
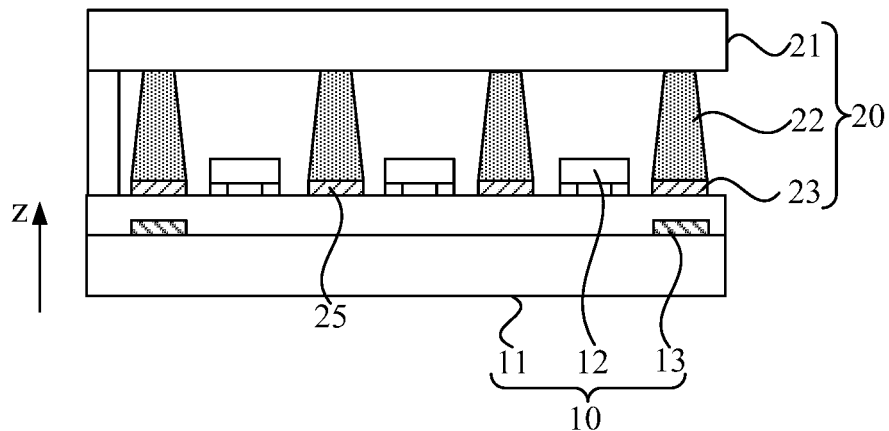
FIG. 9 is a schematic sectional view taken along line A1-A2 in FIG. 8.
Figure 10:
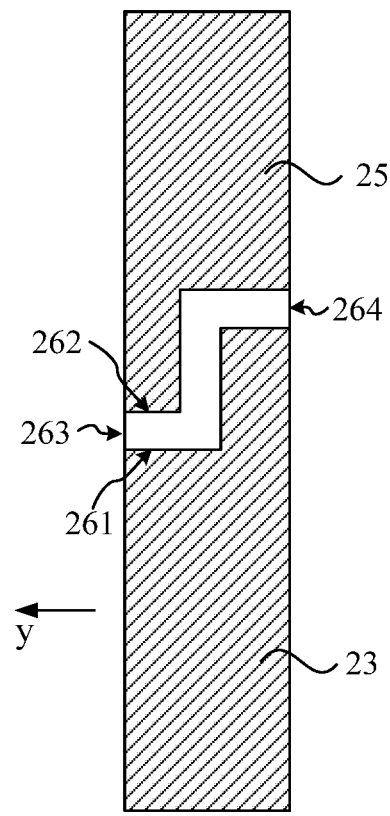
FIG. 10 is a schematic structural view of an insulting gap between a second electrode and a third electrode according to an embodiment of the present disclosure.
Figure 11:
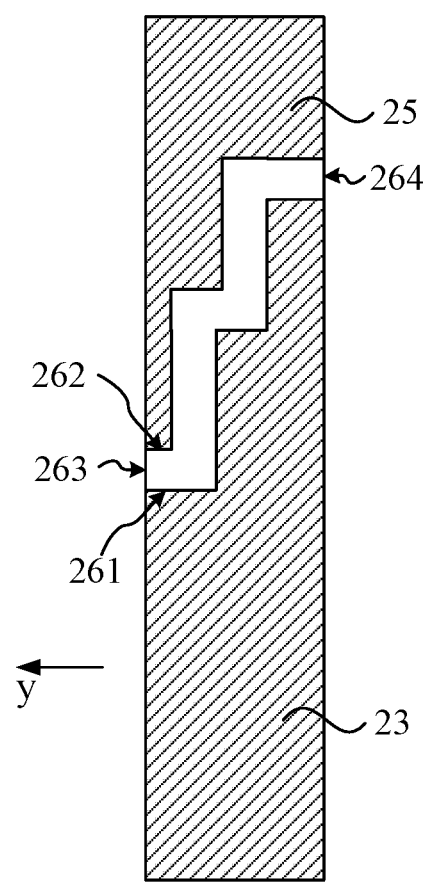
FIG. 11 is a schematic structural view of another insulting gap between a second electrode and a third electrode according to an embodiment of the present disclosure.

FIG. 8 is a schematic top view of yet another display panel according to an embodiment of the present disclosure. FIG. 9 is a schematic sectional view taken along line A1-A2 in FIG. 8. With reference to FIG. 8 and FIG. 9, in an embodiment, the second substrate 20 includes a third electrode 25. Along the first direction z, the third electrode 25 overlaps the retaining wall structure 22. The third electrode 25 and the second electrode 23 are disposed in the same layer, and an insulating gap 26 is disposed between the third electrode 25 and the second electrode 23. Each of FIG. 10 and FIG. 11 is a schematic structural view of an insulating gap between a second electrode and a third electrode according to an embodiment of the present disclosure. With reference to FIG. or FIG. 11, the insulating gap 26 includes a first edge 261, a second edge 262, a first end portion 263, and a second end portion 264. The first end portion 263 and the second end portion 264 are arranged in a second direction y. The projection of the first edge 261 along the second direction y at least covers the first end portion 263. The second direction y intersects a direction pointing from the second electrode 23 to the third electrode 25, and the second direction y is parallel to a plane where the display panel is located.

The third electrode 25 is disposed, which can ensure the integrity of the film layer where the second electrode 23 is located and avoid light leakage in some regions where no second electrode 23 is disposed. The insulating gap 26 is set to extend along the shape of the polyline shown in FIG. 10 or FIG. 11 so that light can be prevented from passing through the insulating gap 26. It is noted that, FIG. 10 and FIG. 11 show shapes of the insulating gap 26 between the second electrode 23 and the third electrode 25. When an insulating gap needs to be disposed between two adjacent second electrodes 23, such insulating gap can also be set to have a shape similar to the shape shown in FIG. 10 or FIG. 11. The shape of the insulating gap 26 shown in FIG. 10 or FIG. 11 is only illustrative and may be designed according to the actual situation during specific implementation, as long as the effect of avoiding light leakage can be realized.

Figure 12:
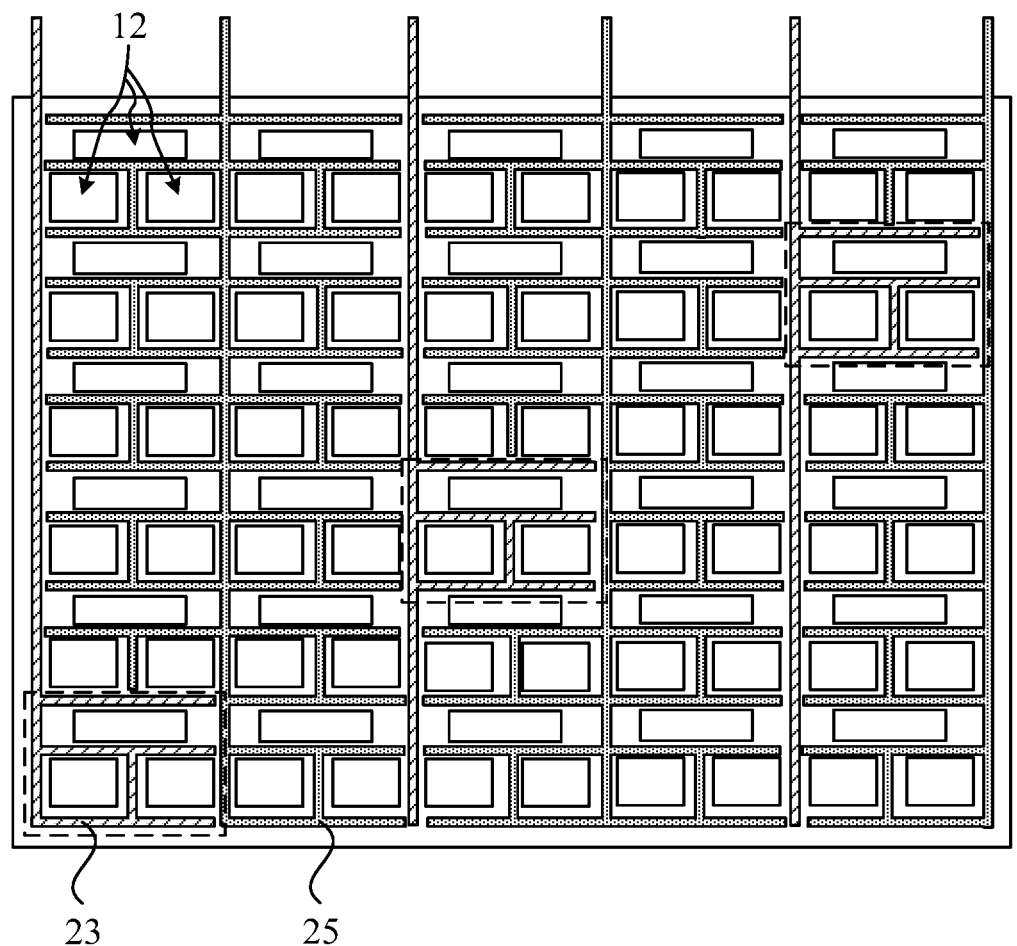
FIG. 12 is a schematic top view of yet another display panel according to an embodiment of the present disclosure.
Figure 13:
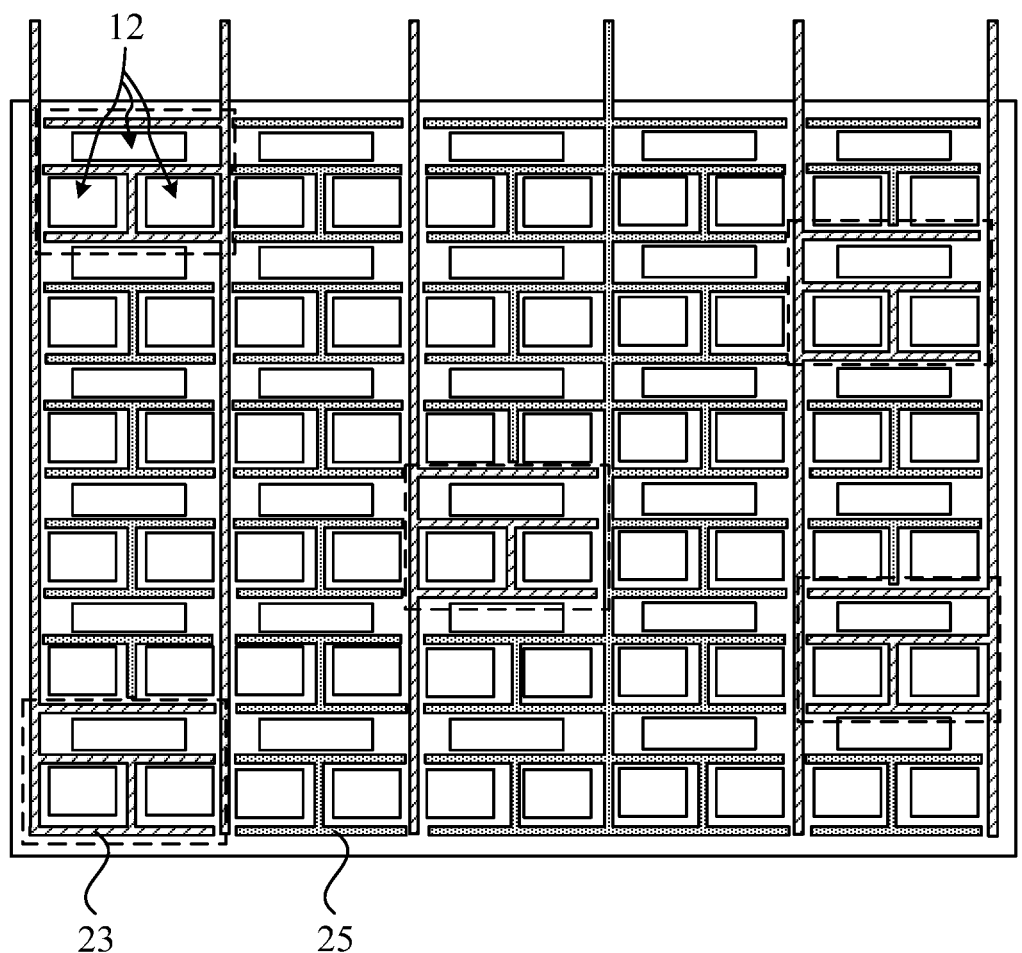
FIG. 13 is a schematic top view of yet another display panel according to an embodiment of the present disclosure.

Each of FIG. 12 and FIG. 13 is a schematic top view of yet another display panel according to an embodiment of the present disclosure. For example, when the second electrode 23 is a detection electrode, three second electrodes 23 are shown in FIG. 12, five second electrodes 23 are shown in FIG. 13, and each second electrode 23 needs to be connected to a second signal terminal (a connection terminal is not shown in FIG. 12 and FIG. 13). The third electrode 25 may be a detection electrode like the second electrode 23, or may be a dummy electrode. The third electrode 25 and the second electrode 23 are insulated from each other. The shape of the insulating gap between the the third electrode 25 and the second electrode 23 may refer to the shape shown in FIG. 10 or FIG. 11, and the specific shape of the insulating gap is not shown in any of FIG. 12 and FIG. 13. With the wiring design in which electrodes are disposed over the entire surface, the uniformity of display can be ensured.

Figure 14:
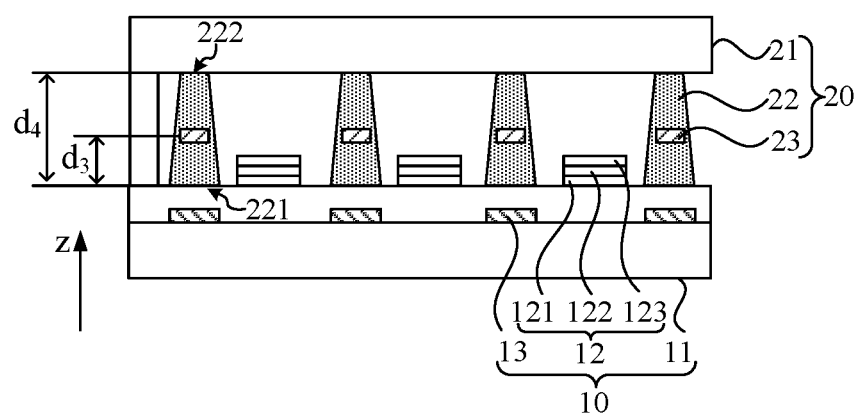
FIG. 14 is a schematic structural view of yet another display panel according to an embodiment of the present disclosure.

FIG. 14 is a schematic structural view of yet another display panel according to an embodiment of the present disclosure. With reference to FIG. 14, In an embodiment, the retaining wall structure 22 includes a first end 221 and a second end 222. The first end 221 is located at a side of the second end 222 away from the second base plate 21. The distance d3 from the second electrode 23 to the first end 221 is less than the distance d4 from the second end 222 to the first end 221.

In the embodiment, the second electrode 23 is disposed inside the retaining wall structure 22. In the preparation process, the retaining wall structure may be divided into two layers to prepare so that the second electrode 23 is disposed inside the retaining wall structure 22; in this way, the risk of a short circuit between the second electrode 23 and the eutectic layer can be avoided, and there is no need to consider whether the second electrode 23 shields light. The second electrode 23 may be made of a metal material or a transparent metal oxide (such as ITO). Adjacent two second electrodes 23 may be directly disconnected without disposing a patterned insulating gap.

With reference to FIG. 14, the light-emitting element 12 includes an anode 121, a light-emitting layer 122 and a cathode 133 that are stacked. In an embodiment, the first electrode 13 is located at a side of the anode 121 of the light-emitting element 12 away from the second substrate 20 so that the distance between the first electrode 13 and the second electrode 23 is relatively far, which facilitates the reflection of the thickness between the two electrodes by measuring the capacitance.

Figure 15:
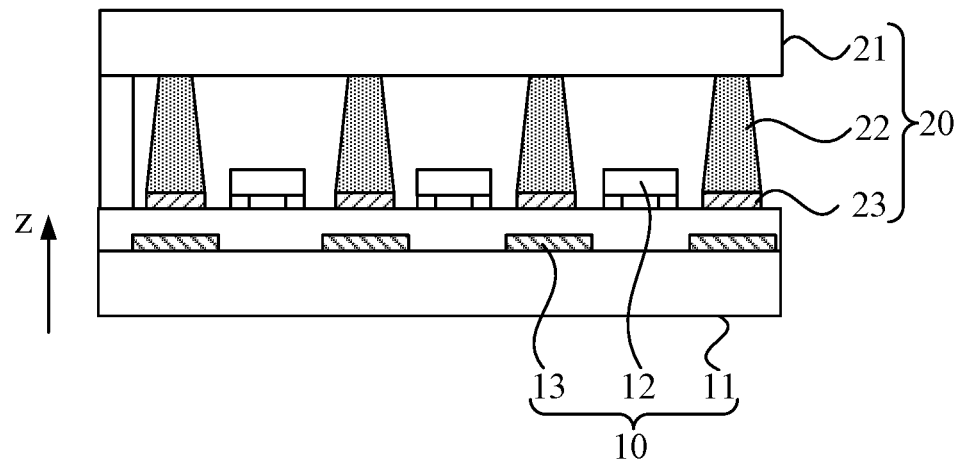
FIG. 15 is a schematic structural view of yet another display panel according to an embodiment of the present disclosure.

FIG. 15 is a schematic structural view of yet another display panel according to an embodiment of the present disclosure. With reference to FIG. 15, in an embodiment, a first cross section of the display panel is taken, the first cross section is perpendicular to the plane where the display panel is located, and the first electrode 13 covers the second electrode 23 along the first direction z in the first cross section.

A pixel circuit layer is disposed in the first substrate 10. The pixel circuit layer includes multiple layers of signal wires. In the embodiment, the width of the first electrode 13 is wider than the width of the second electrode 23 so that a wire (not shown in FIG. 15) disposed below the first electrode 13 can be shielded, the coupling capacitance between the signals in the wire and the second electrode 23 can be avoided, and the measurement accuracy of the capacitance used for measuring the thickness during detection can be improved.

Figure 16:
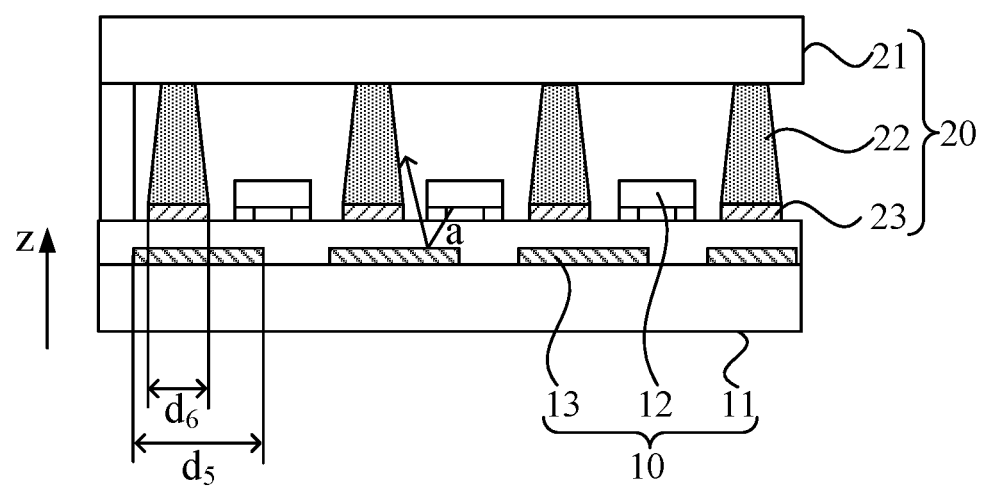
FIG. 16 is a schematic structural view of yet another display panel according to an embodiment of the present disclosure.

FIG. 16 is a schematic structural view of yet another display panel according to an embodiment of the present disclosure. With reference to FIG. 16, in an embodiment, a first cross section of the display panel is taken, the first cross section is perpendicular to the plane where the display panel is located, the width $d_5$ of the first electrode 13 is greater than the width d6 of the retaining wall structure 22 in the first cross section, and the first electrode 13 is reused as a reflection structure for the light-emitting element 12.

It is understood that in some embodiments, there may be a part of beams emitted from the light-emitting elements 12 in directions towards the inside of the display panel, and thus the part of beams cannot be emitted out, which is not good for improving the light-emitting efficiency of the display panel. In the embodiment, the width $d_5$ of the first electrode 13 is set to be greater than the width d6 of the retaining wall structure 22, which makes the first electrode 13 extend below the light-emitting element 12, so that beam a emitted from the light-emitting element 12 is reflected by the first electrode 13 and then emitted out, which is good for improving the light-emitting performance of the display panel.

It is noted that it is merely illustrative that the second electrode 23 is located under the retaining wall structure 22 shown in FIG. 15 and FIG. 16; in other embodiments, the second electrode 23 may be located inside the retaining wall structure 22, and correspondingly, the width of the first electrode 13 may be set to be relatively large.

Figure 17:
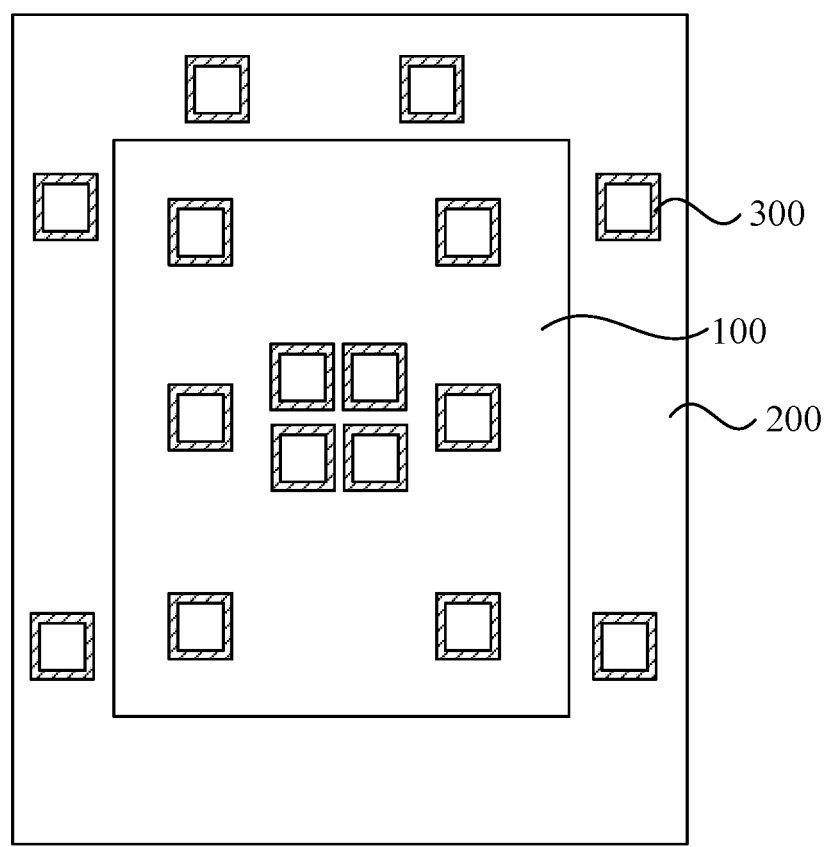
FIG. 17 is a schematic top view of another display panel according to an embodiment of the present disclosure.

FIG. 17 is a schematic top view of another display panel according to an embodiment of the present disclosure. With reference to FIG. 17, in an embodiment, the display panel includes a first region 100 and a second region 200. The first region 100 is located on a side of the second region 200 away from edges of the display panel, and the density of first overlaps 300 in the first region 100 is greater than the density of first overlaps 300 in the second region 200.

The second region 200 is a peripheral region of the display area of the display panel. The first region 100 is a central region of the display area of the display panel. Since the frame of the display panel is generally provided with a structure such as an encapsulant, the probability of defect generation in the second region 200 is less than the probability in the first region 100, and thus the density of the first overlaps 300 in the first region 100 is set to be greater than the density of the first overlaps 300 in the second region 200. Further, the closer first overlaps 300 to the center of the display panel, the greater the density of the first overlaps 300, that is, the greater the density of detection capacitors. The first overlaps 300 shown in FIG. 17 are merely for illustrating the distribution of the detection capacitors, and the specific shape of the first overlaps may be designed according to the shapes of the first electrode and the second electrode.

In an embodiment, the display panel includes a rectangular display area. The first overlaps are spaced along at least one diagonal of the rectangular display area.

Figure 18:
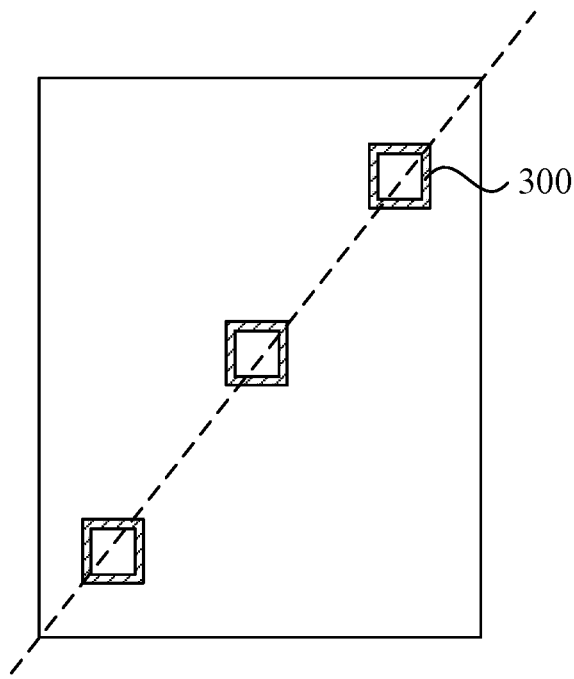
FIG. 18 is a schematic top view of yet another display panel according to an embodiment of the present disclosure.

For example, FIG. 18 is a schematic top view of yet another display panel according to an embodiment of the present disclosure. With reference to FIG. 18, the display panel includes a rectangular display area. Three first overlaps 300 are disposed along the diagonal connecting the lower left corner and the upper right corner of the rectangular display area of the display panel and are used for testing the thicknesses of the lower left, middle, and upper right of the display panel. Signals of the overlaps 300 are connected to an external circuit through wires (not shown in FIG. 18), where the projections of electrodes and wires of both the first electrode and the second electrode may overlap each other because the first electrode and the second electrode are respectively located at two substrates.

Figure 19:
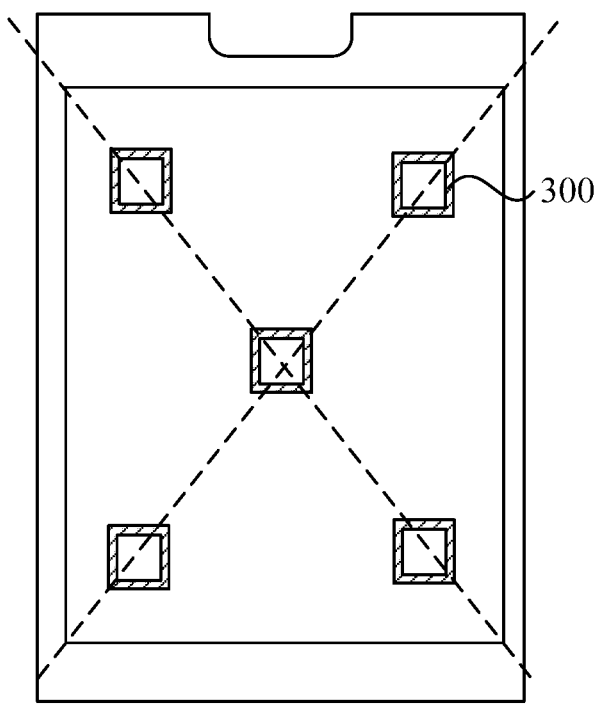
FIG. 19 is a schematic top view of yet another display panel according to an embodiment of the present disclosure.

In another embodiment, more first overlaps may be disposed. For example, FIG. 19 is a schematic top view of yet another display panel according to an embodiment of the present disclosure. With reference to FIG. 19, in the embodiment, five first overlaps 300 are disposed to test thickness information of five positions respectively. In practical implementation, the size, positions, and the number of the first overlaps are not limited here and may be flexibly selected according to the actual situation. The structure shown in FIG. 19 including an irregular region (for example, having a notch at the upper position) may also be regarded as having a rectangular display area as shown in FIG. 19, and the first overlaps are distributed along diagonals of the rectangular display area.

It is noted that in the embodiments of FIG. 18 and FIG. 19, structures of the detection capacitors are shown while electrodes that do not form the detection capacitors are not shown. For example, the third electrodes in the foregoing embodiments are not shown in FIG. 18 and FIG. 19.

In an embodiment, the first substrate includes multiple first electrodes, and the shape of the first electrodes is the same as the shape of the second electrode. The same shape as described herein means that the first electrode and the second electrode surround the same number of light-emitting elements and have the same profile. In this way, multiple independent detection capacitors may be disposed, and partial region may be detected separately during charging, thereby reducing interference. The widths of specific electrodes may be different, for example, the width of the first electrode may be greater than the width of the second electrode.

Figure 20:
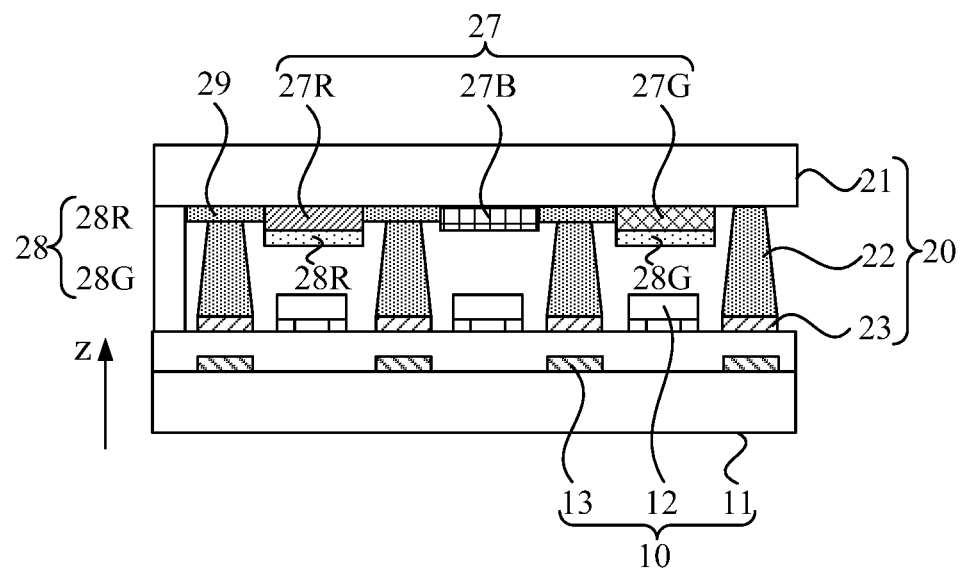
FIG. 20 is a schematic structural view of yet another display panel according to an embodiment of the present disclosure.

FIG. 20 is a schematic structural view of yet another display panel according to an embodiment of the present disclosure. With reference to FIG. 20, in an embodiment, a color resist layer 27 which is in correspondence to the light-emitting elements 12 is provided on a side of the second substrate 20 near the first substrate 10. A color conversion layer 28 is disposed on a side of the color resist layer 27 near the light-emitting elements 12. The display panel further includes a light-shielding layer 29. Along a direction pointing from the second substrate 20 to the first substrate 10, the light-shielding layer 29 covers the retaining wall structure 22. In an embodiment, all the light-emitting elements 12 emit light of blue. The color resist layer 27 includes a red color resist 27R, a green color resist 27G, and a blue color resist 27B. The color conversion layer 28 includes a red quantum dot structure 28R and a green quantum dot structure 28G. The red quantum dot structure 28R is located on a side of the red color resist 27R near the light-emitting element 12, and the green quantum dot structure 28G is located on a side of the green color resist 27G near the light-emitting element 12, so as to realize the color display of the display panel. In practical implementation, a scattering layer may be disposed on a side of the blue color resist 27B near the light-emitting element 12 to improve the light-emitting uniformity of a blue sub-pixel.

In an embodiment, the retaining wall structure and the light-shading layer are made of the same material. For example, the retaining wall structure 22 and the light-shielding layer 29 may both be made of black ink, which together function as a light shield.

Figure 21:
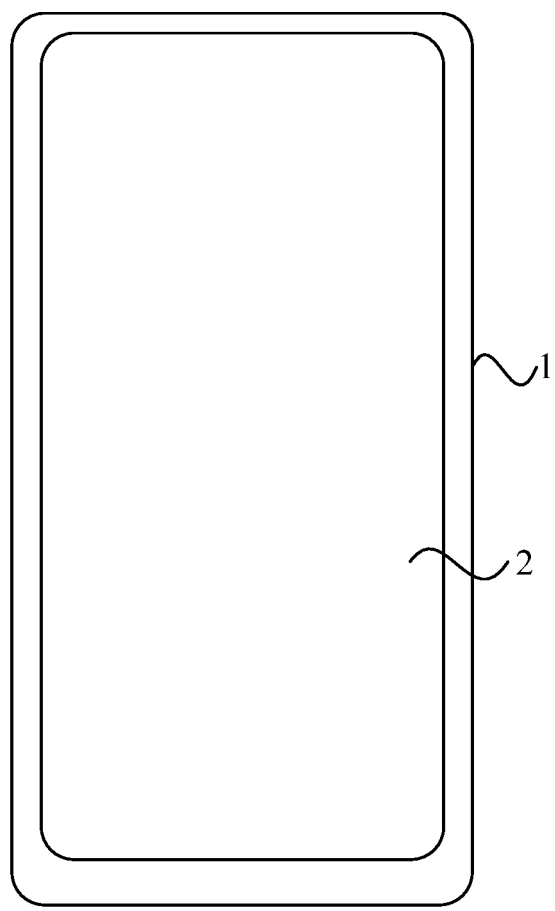
FIG. 21 is a schematic structural view of a display device according to an embodiment of the present disclosure.

FIG. 21 is a schematic structural view of a display device according to an embodiment of the present disclosure. With reference to FIG. 12, the display device 1 includes the display panel 2 according to any foregoing embodiment of the present disclosure. The display device 1 may specifically be a mobile phone, a computer, an intelligent wearable device, and the like.

It is noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising a first substrate and a second substrate which are disposed oppositely;
wherein the first substrate comprises a first base plate and light-emitting elements, the light-emitting elements are located on a side of the first base plate near the second substrate, the second substrate comprises a second base plate and a retaining wall structure, the retaining wall structure is located on a side of the second base plate near the first substrate, and an orthographic projection of the retaining wall structure onto the first substrate is located between adjacent light-emitting elements;
wherein the first substrate comprises a first electrode, the second substrate comprises a second electrode, the first electrode and the second electrode at least partially overlap in a first direction to form a first overlap, and the retaining wall structure and the first overlap at least partially overlap in the first direction, the first direction being a direction perpendicular to a plane where the display panel is located; and
wherein the first electrode is electrically connected to a first signal terminal, the second electrode is electrically connected to a second signal terminal, and one of the first signal terminal and the second signal terminal is a signal detection terminal, and the other is a signal input terminal;
wherein the signal detection terminal is electrically connected to a detection circuit, and the detection circuit measures a capacitance value of a capacitor formed by the first overlap according to a charging duration;
wherein the second electrode is located on a side of the retaining wall structure near the first substrate; and
wherein in a direction perpendicular to an extension direction of the retaining wall structure, a width of the second electrode is less than or equal to a width of the retaining wall structure.

2. The display panel of claim 1, wherein the second signal terminal is the signal detection terminal.

3. The display panel of claim 2, wherein a plurality of second electrodes are arranged in a matrix on the display panel, and one second electrode is electrically connected to one second signal terminal.

4. The display panel of claim 1, wherein the retaining wall structure comprises a light-shielding material, and the second electrode comprises a light-shielding metal.

5. The display panel of claim 1, wherein an orthographic projection of the second electrode onto the first substrate surrounds at least one of the light-emitting elements.

6. The display panel of claim 1, wherein the second substrate comprises a third electrode, wherein along the first direction, the third electrode overlaps the retaining wall structure; the third electrode and the second electrode are disposed in a same layer, and an insulating gap is disposed between the third electrode and the second electrode; the insulating gap comprises a first edge, a second edge, a first end portion, and a second end portion, the first end portion and the second end portion are arranged in a second direction, a projection of the first edge along the second direction at least covers the first end portion, and the second direction intersects a direction pointing from the second electrode to the third electrode.

7. The display panel of claim 1, wherein the retaining wall structure comprises a first end and a second end, the first end is located at a side of the second end away from the second base plate, and a distance from the second electrode to the first end is less than a distance from the second end to the first end.

8. The display panel of claim 7, wherein the first electrode is located at a side of an anode of the light-emitting element away from the second substrate.

9. The display panel of claim 1, wherein a first cross section is taken for the display panel, the first cross section is perpendicular to the plane where the display panel is located, and in the first cross section, the first electrode covers the second electrode along the first direction.

10. The display panel of claim 1, wherein a first cross section is taken for the display panel, the first cross section is perpendicular to the plane where the display panel is located, a width of the first electrode is greater than a width of the retaining wall structure in the first cross section, and the first electrode is reused as a reflection structure for the light-emitting element.

11. The display panel of claim 1, comprising a first region and a second region, wherein the first region is located on a side of the second region away from edges of the display panel, and a density of first overlaps in the first region is greater than a density of first overlaps in the second region.

12. The display panel of claim 1, comprising a rectangular display area, wherein first overlaps are spaced along at least one diagonal of the rectangular display area.

13. The display panel of claim 1, wherein the first substrate comprises a plurality of first electrodes, and a shape of each of the plurality of first electrodes is the same as a shape of the second electrode.

14. The display panel of claim 1, wherein a color resist layer which is in correspondence to the light-emitting elements is provided on a side of the second substrate near the first substrate, and a color conversion layer is disposed on a side of the color resist layer near the light-emitting elements; and wherein the display panel further comprises a light-shielding layer, and along a direction pointing from the second substrate to the first substrate, the light-shielding layer covers the retaining wall structure.

15. The display panel of claim 14, wherein the retaining wall structure and the light-shielding layer are formed of a same material.

16. A detection method for a display panel, applied to a display panel,
wherein the display panel comprises a first substrate and a second substrate which are disposed oppositely;
wherein the first substrate comprises a first base plate and light-emitting elements, the light-emitting elements are located on a side of the first base plate near the second substrate, the second substrate comprises a second base plate and a retaining wall structure, the retaining wall structure is located on a side of the second base plate near the first substrate, and an orthographic projection of the retaining wall structure onto the first substrate is located between adjacent light-emitting elements;
wherein the first substrate comprises a first electrode, the second substrate comprises a second electrode, the first electrode and the second electrode at least partially overlap in a first direction to form a first overlap, and the retaining wall structure and the first overlap at least partially overlap in the first direction, the first direction being a direction perpendicular to a plane where the display panel is located;
wherein the first electrode is electrically connected to a first signal terminal, the second electrode is electrically connected to a second signal terminal, and one of the first signal terminal and the second signal terminal is a signal detection terminal, and the other is a signal input terminal;
wherein the signal detection terminal is electrically connected to a detection circuit, and the detection circuit measures a capacitance value of a capacitor formed by the first overlap according to a charging duration;
wherein the second electrode is located on a side of the retaining wall structure near the first substrate; and
wherein in a direction perpendicular to an extension direction of the retaining wall structure, a width of the second electrode is less than or equal to a width of the retaining wall structure;
wherein the detection method comprises:
inputting a direct current charging signal into the signal input terminal;
detecting a sensing signal at the signal detection terminal to obtain a charging duration;
comparing capacitance values of capacitors formed by the first overlap formed by the first electrode and the second electrode at different positions according to charging durations; and
determining a thickness between the first electrode and the second electrode according to the capacitance value of the capacitor.

17. A display device, comprising a display panel,
wherein the display panel comprises a first substrate and a second substrate which are disposed oppositely;
wherein the first substrate comprises a first base plate and light-emitting elements, the light-emitting elements are located on a side of the first base plate near the second substrate, the second substrate comprises a second base plate and a retaining wall structure, the retaining wall structure is located on a side of the second base plate near the first substrate, and an orthographic projection of the retaining wall structure onto the first substrate is located between adjacent light-emitting elements;
wherein the first substrate comprises a first electrode, the second substrate comprises a second electrode, the first electrode and the second electrode at least partially overlap in a first direction to form a first overlap, and the retaining wall structure and the first overlap at least partially overlap in the first direction, the first direction being a direction perpendicular to a plane where the display panel is located;
wherein the first electrode is electrically connected to a first signal terminal, the second electrode is electrically connected to a second signal terminal, and one of the first signal terminal and the second signal terminal is a signal detection terminal, and the other is a signal input terminal;
wherein the signal detection terminal is electrically connected to a detection circuit, and the detection circuit measures a capacitance value of a capacitor formed by the first overlap according to a charging duration; wherein the second electrode is located on a side of the retaining wall structure near the first substrate; and wherein in a direction perpendicular to an extension direction of the retaining wall structure, a width of the second electrode is less than or equal to a width of the retaining wall structure.

* * * * *